United States Patent
Yu et al.

(10) Patent No.: US 8,987,922 B2
(45) Date of Patent: Mar. 24, 2015

(54) METHODS AND APPARATUS FOR WAFER LEVEL PACKAGING

(71) Applicant: Taiwan Semiconductor Manufacturing Company, Ltd., Hsin-Chu (TW)

(72) Inventors: Tsung-Yuan Yu, Taipei (TW);
Hsien-Wei Chen, Hsin-Chu (TW);
Wen-Hsiung Lu, Jhonghe (TW);
Hung-Jen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/802,306

(22) Filed: Mar. 13, 2013

(65) Prior Publication Data

US 2014/0252558 A1    Sep. 11, 2014

Related U.S. Application Data

(60) Provisional application No. 61/776,629, filed on Mar. 11, 2013.

(51) Int. Cl.
*H01L 23/544* (2006.01)
*H01L 21/78* (2006.01)
*H01L 23/31* (2006.01)

(52) U.S. Cl.
CPC .............. *H01L 21/78* (2013.01); *H01L 23/544* (2013.01); *H01L 23/3192* (2013.01); *H01L 2224/13* (2013.01)
USPC .................. 257/797; 257/678; 257/E21.006; 257/E21.007; 257/E21.32; 257/E21.126; 257/E21.127; 257/E21.267; 257/E21.499; 257/E21.502; 257/E21.508; 257/E21.509; 257/E21.511; 257/E21.568

(58) Field of Classification Search
USPC ......... 257/797, 678, 688, 170, 620, 676, 754, 257/E21.006, E21.007, E21.126, E21.127, 257/E21.267, E21.499, E21.502, E21.508, 257/E21.509, E21.511, E21.568
See application file for complete search history.

(56) References Cited

U.S. PATENT DOCUMENTS

| | | | | |
|---|---|---|---|---|
| 6,975,022 | B2 * | 12/2005 | Sakamoto et al. | 257/676 |
| 7,138,296 | B2 * | 11/2006 | Sakamoto et al. | 438/113 |
| 7,205,636 | B2 * | 4/2007 | Koike | 257/620 |
| 2012/0223445 | A1 | 9/2012 | Lehr | |

* cited by examiner

*Primary Examiner* — David Nhu
(74) *Attorney, Agent, or Firm* — Slater & Matsil, L.L.P.

(57) ABSTRACT

A semiconductor device includes a substrate, a bond pad above the substrate, a guard ring above the substrate, and an alignment mark above the substrate, between the bond pad and the guard ring. The device may include a passivation layer on the substrate, a polymer layer, a post-passivation interconnect (PPI) layer in contact with the bond pad, and a connector on the PPI layer, wherein the connector is between the bond pad and the guard ring, and the alignment mark is between the connector and the guard ring. The alignment mark may be at the PPI layer. There may be multiple alignment marks at different layers. There may be multiple alignment marks for the device around the corners or at the edges of an area surrounded by the guard ring.

20 Claims, 10 Drawing Sheets

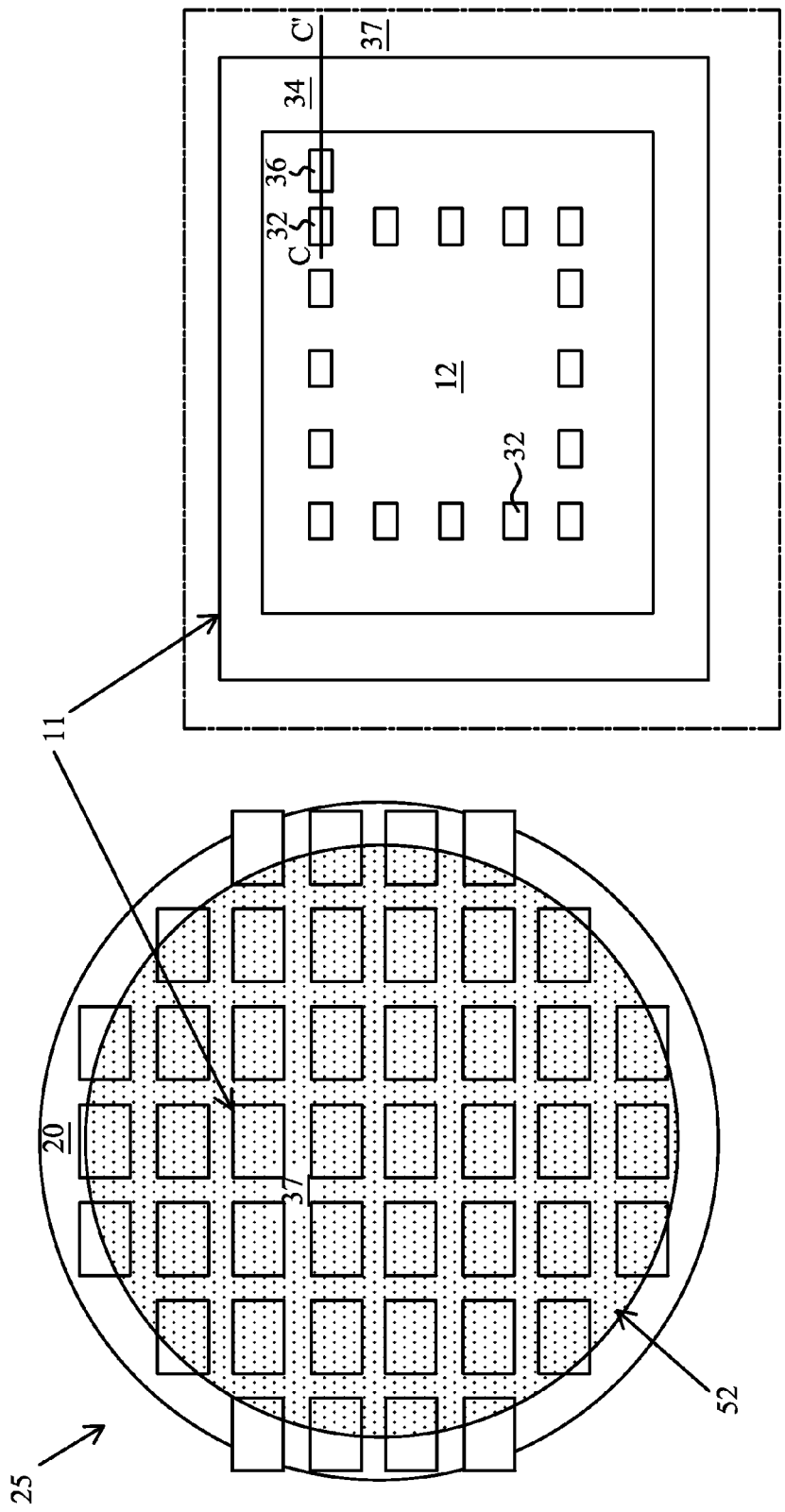

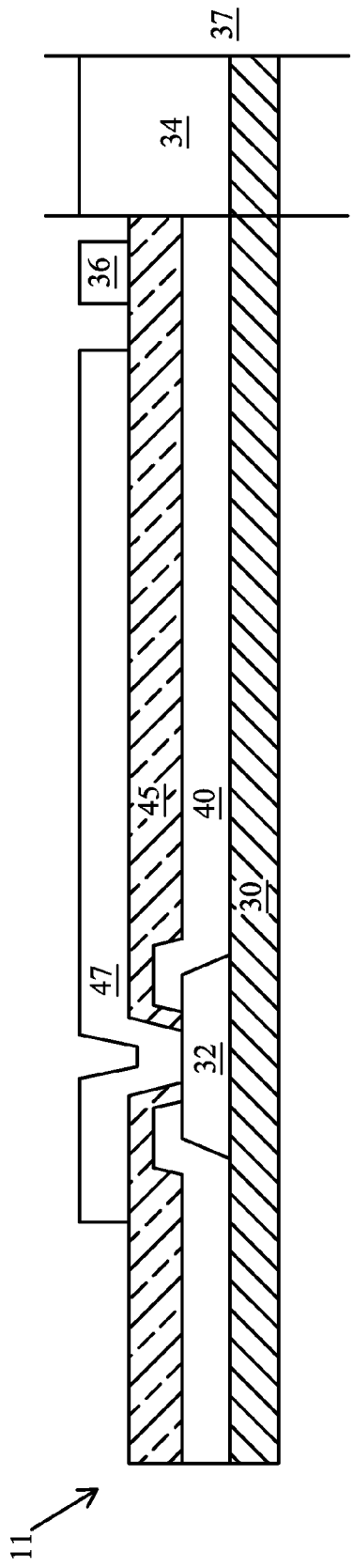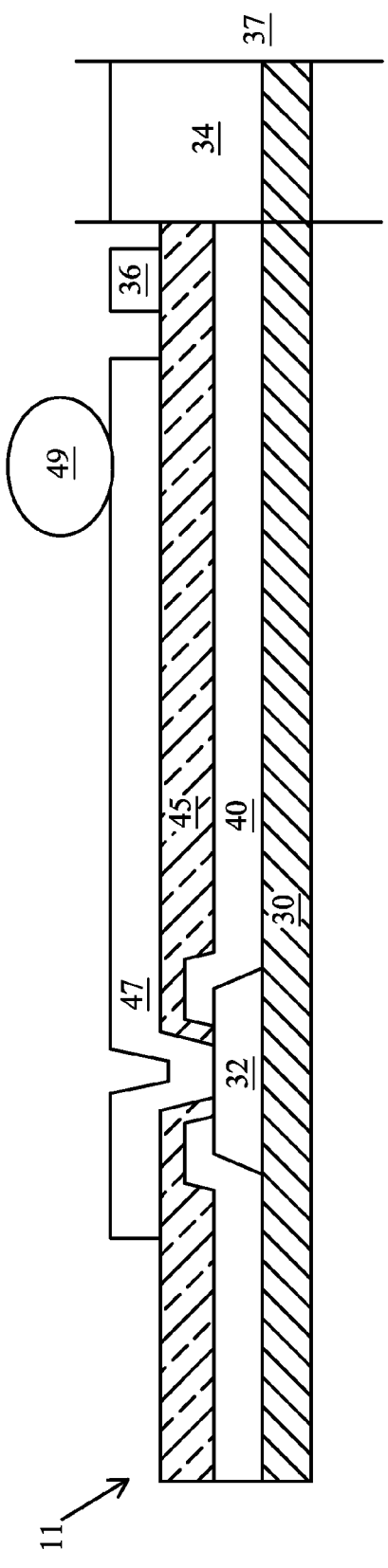
Figure 4(a)
Figure 4(b)

METHODS AND APPARATUS FOR WAFER LEVEL PACKAGING

This application claims the benefit of U.S. Provisional Application No. 61/776,629, filed on Mar. 11, 2013, entitled "Methods and Apparatus for Wafer Level Packaging", which application is hereby incorporated herein by reference.

BACKGROUND

Since the invention of the integrated circuit (IC), the semiconductor industry has experienced rapid growth due to continuous improvements in the integration density of a variety of electronic components. For the most part, this improvement in integration density has come from repeated reductions in minimum feature size, which allows more components to be integrated into a given area. As the demand for even smaller electronic devices has grown, there has grown a need for smaller and more creative packaging technologies of semiconductor dies.

Conventional packaging technologies divide a wafer into separate dies and package each individual die, following a sequence of placing a single die on the package substrate, forming first-level interconnects generally via wire bond or flip chip, encapsulation, test, inspection, and second level interconnect to the circuit board in final assembly. These technologies and processes are time consuming.

Wafer level package (WLP) technology is the technology of packaging dies at wafer level. WLP technology can produce dies with small dimensions and good electrical properties, and is currently widely used for its low cost and relatively simple processes. WLP technology basically extends the wafer fab processes to include device interconnection and device protection processes. In WLP technology, back end of line (BEOL) processes involve a few mask layers beginning with a polymer dielectric layer, a redistribution layer, an under bump metallization, and wafer bumping all prior to dicing. Sometimes encapsulation is also performed at wafer level before the entire wafer is singulated in the dicing process.

Dicing is the process by which dies are separated from a wafer. The dicing process can be accomplished by scribing and breaking, by mechanical sawing (normally with a machine called a dicing saw) or by laser cutting. In WLP technology, the encapsulation material such as a molding compound may cover scribe lines of the wafers and reduce the die sawing accuracy. Methods and apparatus are needed to increase the die sawing accuracy for WLP packages in the dicing process.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1(a)-1(b) illustrate in top views a wafer level package (WLP) comprising multiple dies covered by a molding compound, in accordance with some embodiments;

FIGS. 4(a)-4(d) illustrate a process of forming a wafer level package (WLP) with an alignment mark on dies, in accordance with some embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 2A:
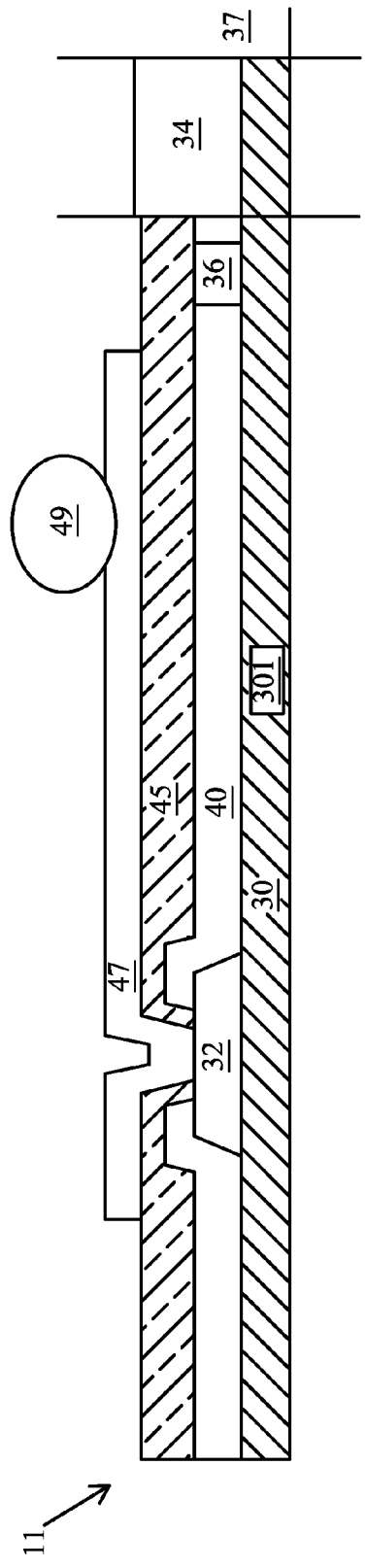
FIGS. 2(a)-2(e) illustrate in cross-sectional views an alignment mark on a die, to be used to assist the dicing of the WLP package, in accordance with some embodiments.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

The making and using of the embodiments are discussed in detail below. A semiconductor device comprises a substrate, a bond pad above the substrate, a guard ring above the substrate, and an alignment mark above the substrate, between the bond pad and the guard ring. The device may further comprise a passivation layer on the substrate, a polymer layer on the passivation layer, a post-passivation interconnect (PPI) layer above the polymer layer and in contact with the bond pad, and a connector on the PPI layer, wherein the connector is between the bond pad and the guard ring, and the alignment mark is between the connector and the guard ring. The alignment mark may be at the PPI layer above the polymer layer. There may be multiple alignment marks at different layers. There may be multiple alignment marks for the device around the corners or at the edges of an area surrounded by the guard ring. The alignment mark may be used to increase the accuracy during the dicing process by which the die is separated from the wafer level package (WLP).

In the following description, embodiments are disclosed in the context of forming a contact for a metal gate transistor so that the metal gate has a smaller resistance. The device may comprise an active area comprising a source, a drain, and a channel between the source and the drain, an isolation area surrounding the active area, and a metal gate above the isolation area, and above the channel, wherein the metal gate comprises a conductive layer. The device further comprises a contact, wherein the contact comprises a first contact part formed within the conductive layer of the metal gate, above the isolation area without vertically overlapping the active area and, and a second contact part above the first contact part, connected to the first contact part, and substantially vertically contained within the first contact part. The larger first contact part is formed because a larger part of the conductive layer of the metal gate is removed, therefore the resistance of the metal gate is reduced.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1(a) illustrates in a top view a wafer level package (WLP) 25 comprising multiple dies 11 fabricated on a wafer 20 and covered by a molding compound 52, in accordance with some embodiments. More details of a die 11 and its surrounding area are shown in FIG. 1(b).

FIG. 1(a) illustrates a WLP package 25. The WLP package 25 may be a wafer-level chip scale package (WLCSP), a fan-out wafer level package (FO-WLP), an embedded wafer level package (embedded WLP), a three-dimensional wafer level package (3D WLP), or a wafer level MEMS (WLP MEMS). The WLP package 25 may be any other WLP package developed in various other technologies and for various applications.

The die 11 may be a chip made of various technologies such as CMOS chip, a GaAs chip, a SiGe chip, or an integrated passive device (IPD). The die 11 may be for any function such as a processor, a memory chip, a power amplifier, an optoelectronic device such as an image sensor, or an A/D converter.

The package 25 comprises a plurality of dies 11 formed on a wafer 20, separated by scribe lines 37. The wafer 20 is used as a carrier for fabrication during the production of dies. After semiconductor fabrication processes, a plurality of dies 11 is formed. These dies 11 are later separated through a die cutting or singulation process in which typically a mechanical or laser saw is used to cut through the wafer between individual dies 11. To facilitate the die cutting process, relatively narrow sacrificial scribe lines 37 are provided on the wafer 20 along which the cuts are made to separate the dies 11. The scribe line 37 is an area between two dies. The scribe line 37 may include a plurality of test pads for testing purposes, not shown. A die 11 together with the scribe line 37 surrounding the die 11 is shown in FIG. 1(b).

The molding compound 52 covers the top of the dies 11 and the scribe lines 37. In one embodiment, the molding compound 52 may be a nonconductive material, such as an epoxy, a resin, a moldable polymer, or the like. The molding compound 52 may be formed to provide lateral support to structures, such as connectors, formed on the dies 11. The molding compound 52 may be shaped or molded using a mold. A release compound may be optionally applied to the mold to prevent the molding compound 52 from adhering to the mold.

More details of the die 11 and its surrounding area are shown in FIG. 1(b). As illustrated in FIG. 1(b), a scribe line 37 is around the die 11, where the scribe line 37 is located outside the edge of die 11. The die 11 comprises a guard ring 34. A plurality of bond pads 32 is located within the area surrounded by the guard ring 34. The bond pads 32 surround an active area 12. An alignment mark 36 may be located between a bond pad 32 and the guard ring 34. There may be multiple alignment marks, not shown.

As illustrated in FIG. 1(b), the die 11 is surrounded by the guard ring 34. The guard ring 34 may be generally formed of conductive materials similar to bond pads 32, such as for example aluminum (Al), aluminum-copper (Al—Cu) alloy, or aluminum-copper-silicon (Al—Cu—Si) alloy. The guard ring 34 is placed outside of bond pads 32 and protects the die 11. The guard ring 34 may be referred as a seal ring as well. For some embodiments, the size of the guard ring 34 from edge to edge may be of about 10 µm.

The active area 12 may be made up of millions of components such as active devices and passive devices on a substrate. The active area 12 contains the majority of the high density, active circuitry of the die 11. These components may be initially isolated from each other, formed on an underlying substrate, and are later interconnected together by metal interconnect lines to form the functional circuit. Typical interconnect structures include lateral interconnections, such as metal lines or wirings, and vertical interconnections, such as vias and contacts. The side of the substrate on which the devices are formed may be referred to as the top side of the die.

Bond pads 32 may be used to supply voltage signals to the circuitry within the active area 12. These voltage signals are supplied to the bond pads 32 through a package to which the integrated circuit device 11 is affixed. In general, after the devices are fabricated, bond pads 32 lie beneath dielectric layers and must be exposed for testing and bonding to a suitable package. The electrical signals from the active area 12 are routed through the network of metal layers to one or more of the bond pads 32 which are further connected to solder bumps or other connectors according to the function of the semiconductor device.

An alignment mark 36 is between a bond pad 32 and the guard ring 34. There may be multiple alignment marks formed, which are not shown. The alignment mark 36 may be formed at a same layer as the bond pad 32 is at, and above a substrate, not shown. The alignment mark 36 may be used to increase the accuracy during the dicing process by which the die 11 is separated from the WLP 25. In WLP technology, the molding compound 52 shown in FIG. 1(a) may cover scribe lines 37 and reduce the die sawing accuracy. The use of alignment marks 36 can increase the die sawing accuracy for the WLP package 25. The alignment mark 36 may not be a functional block of the die 11 to perform any function for the die 11. Instead, it may be formed for assisting the dicing purpose and it is isolated electrically from any other functional blocks of the die 11.

FIGS. 2(a)-2(e) illustrate in cross-sectional views an alignment mark 36 on a die 11 between a bond pad 32 and the guard ring 34, in accordance with some embodiments. The FIGS. 2(a)-2(e) may be the cross section view of the line CC' of FIG. 1(b), where only one bond pad 32 is shown. There may be multiple alignment marks 36 formed on the die 11, which will be illustrated in FIGS. 3(a)-3(e).

Figure 2B:
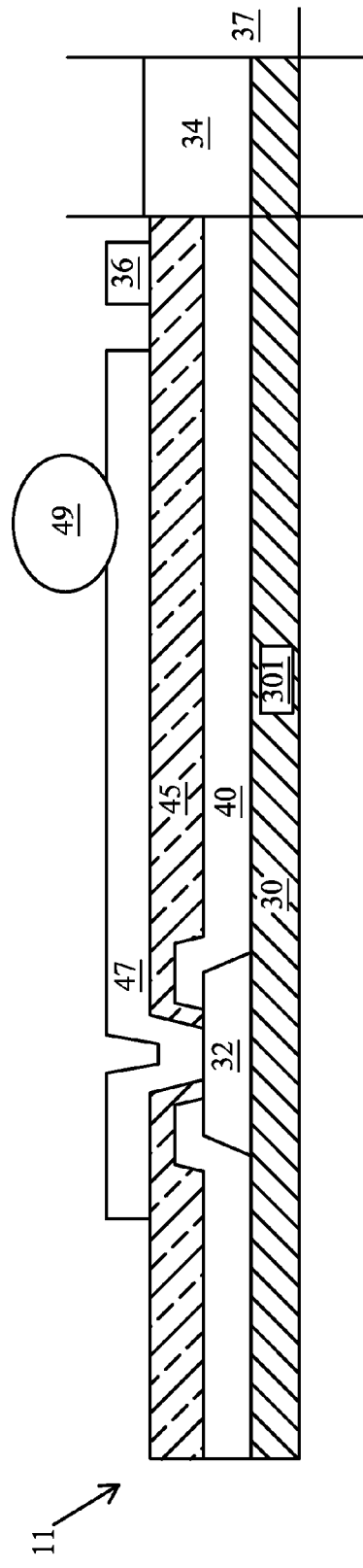
Figure 2C:
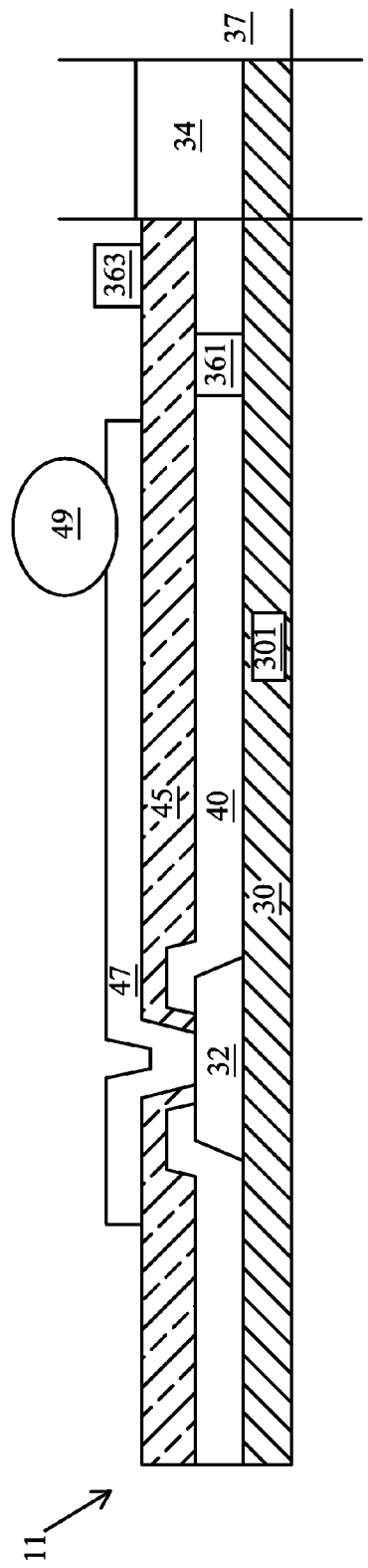

As illustrated in FIGS. 2(a)-2(c), the die 11 comprises the bond pad 32 and the guard ring 34 formed on a substrate 30. The alignment mark 36 is formed above the substrate 30, between the bond pad 32 and the guard ring 34. Devices such as active devices or passive devices 301 may be formed within the substrate 30. The die 11 further comprises a passivation layer 40 on the substrate 30, covering a part of the bond pad 32 while exposing the bond pad 32. The die 11 further comprises a polymer layer 45 on the passivation layer 40 and partially exposing the bond pad 32. The die 11 further comprises a post-passivation interconnect (PPI) layer 47 above the polymer layer 45 and in contact with the bond pad 32. The die 11 further comprises a connector 49 on the PPI layer 47, wherein the connector 49 is between the bond pad 32 and the guard ring 34, and the alignment mark 36 is between the connector 49 and the guard ring 34. More details of each component are given below.

The substrate 30 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used for the substrate 30 include multi-layered substrates, gradient substrates, or hybrid orientation substrates.

Devices such as active devices or passive devices 301 may be formed on the substrate 30. As one of ordinary skill in the art will recognize, a wide variety of active devices and passive devices such as capacitors, resistors, inductors and the like may be used to generate the desired structural and functional requirements of the design for the die 11. The devices 301 may be formed using any suitable methods either within or else on the surface of the substrate 30.

There may be a plurality of metallization layers, not shown, formed over the substrate 30 and the devices 301 and are designed to connect the devices 301 to form functional circuitry. The metallization layers may be formed of alternating layers of dielectric and conductive material (e.g., copper) and may be formed through any suitable process (such as deposition, damascene, dual damascene, etc.).

The bond pad 32 may be formed over and electrically connected to devices 301 by the metallization layers. The bond pad 32 may comprise aluminum (Al), copper (Cu), tin (Sn), nickel (Ni), gold (Au), silver (Ag), or other electrically conductive material. The bond pad 32 may be formed using a deposition process, such as sputtering, to form a layer of material (not shown) and portions of the layer of material may then be removed through a suitable process (such as photolithographic masking and etching) to form the bond pad 32. However, any other suitable process may be utilized to form the bond pad 32. The bond pad 32 may be formed to have a thickness of between about 0.5 μm and about 4 μm, such as about 1.45 μm. The size, shape, and location of the bond pad 32 are only for illustration purposes and are not limiting. The plurality of bond pads 32, which are not shown, may be of the same size or of different sizes.

The passivation layer 40 is formed over the surface of the substrate 30 and on top of the bond pad 32 for structural support and physical isolation. In some embodiment, the passivation layer 40 stops before the guard ring 34 as shown in FIGS. 2(a)-2(c). In some alternative embodiment, the passivation layer 40 may be formed over the guard ring 34 and the active areas, and not on the scribe line 37. The passivation layer 40 may be made with silicon nitride (SiN), silicon dioxide (SiO2), silicon oxynitride (SiON), polyimide (PI), benzocyclobutene (BCB), polybenzoxazole (PBO), or other insulating material. An opening of the passivation layer 40 is made by removing a portion of the passivation layer 40 using a mask-defined photoresist etching process to expose the bond pad 32. The size, shape, and location of the opening made are only for illustration purposes and are not limiting. It is advantageous to expose a portion of the top surface of the bond pad 32, as shown in FIGS. 2(a)-2(c).

The polymer layer 45 is formed over the passivation layer 40 and over the opening of the passivation layer 40 to cover the bond pad 32. In some embodiment, the polymer layer 45 stops before the guard ring 34 as shown in FIGS. 2(a)-2(c). In some alternative embodiment, the polymer layer 45 may be formed over the guard ring 34 and the active areas, and not on the scribe line 37. The polymer layer 45 may be formed of a polymer, such as an epoxy, polyimide, benzocyclobutene (BCB), polybenzoxazole (PBO), and the like, although other relatively soft, often organic, dielectric materials can also be used. The formation methods include spin coating or other commonly used methods. The thickness of the polymer layer 45 may be preferably between about 5 μm and about 30 μm. The dimensions recited throughout the description are merely examples, and will change with the down-scaling of integrated circuits.

The post-passivation interconnect (PPI) layer 47 is formed above the polymer layer 45 and in contact with the bond pad 32. The PPI layer 47 may be called a redistribution layer as well. The PPI layer 47 may be formed of alternating layers of dielectric and conductive material and may be formed through any suitable process (such as deposition, damascene, dual damascene, etc.). The PPI layer 47 may be made with, e.g., Al, Cu, or a Cu alloy. The PPI layer 47 can be made by an electrolytic plating, sputter, PVD or electroless plating process. The die 11 may comprise a number of PPI layer 47 to form a network of inter-level interconnects which may electrically connect to the bond pads 32 according to the function of the die 11.

The connector 49 is formed and in contact with the PPI layer 47. The connector 49 may be a solder bump, a solder ball, or any other like connection device to achieve electrical connection between two objects. Any of those connection devices may be simply referred as a connector. The connector 49 may be a solder ball comprising the alloys of tin, lead, silver, copper, nickel, bismuth, and the like. Alternatively, the connector 49 may be a copper bump formed by, for example, plating, print, and the like. The connector 49 is between the bond pad 32 and the guard ring 34, and the alignment mark 36 is between the connector 49 and the guard ring 34.

The alignment mark 36 is above the substrate 30 and between the bond pad 32 and the guard ring 34. The connector 49 is between the bond pad 32 and the alignment mark 36. The alignment mark 36 may be at various layers of the die 11, such as the passivation layer 40, or the PPI layer 47. As illustrated in FIG. 2(a), the alignment mark 36 may be located at the same layer as the bond pad 32, covered by the passivation layer 40, which is further covered by the polymer layer 45. Alternatively, the alignment mark 36 may be located at the same layer as the PPI layer 47, above the polymer layer 45, as shown in FIG. 2(b). Multiple alignment marks may exist at multiple layers. In the embodiment shown in FIG. 2(c), a first alignment mark 361 is at the same layer as the bond pad 32 covered by the passivation layer 40. A second alignment mark 363 is at the PPI layer 47. The first alignment mark 361 and the second alignment mark 363 may be at a different location vertically.

Figure 2D:
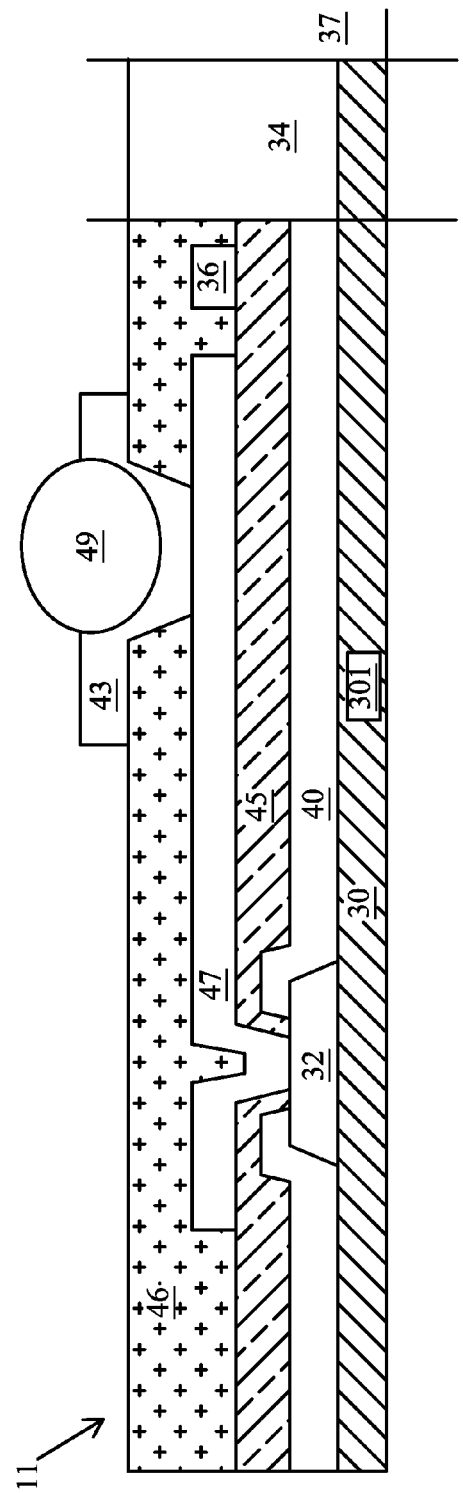

The FIG. 2(d) illustrates an alternative embodiment for the die 11 with an alignment mark 36 between a bond pad 32 and the guard ring 34. As shown in FIG. 2(d), in addition to the layers shown in FIGS. 2(a)-2(c), the die 11 further comprises a second polymer layer 46 covering the PPI layer 47 and the first polymer layer 45, with an opening to expose the PPI layer 47. A under bump metal (UBM) layer 43 is over the second polymer layer 46, covering the opening of the second polymer layer 46, and may be electrically connected to the PPI layer 47 which is further connected to the bond pad 32. The connector 49 is placed on the UBM layer 43. The connector 49 is between the bond pad 32 and the guard ring 34, and the alignment mark 36 is between the connector 49 and the guard ring 34. The alignment mark 36 is at the same layer as the PPI layer 47. The alignment mark 36 is further covered by the second polymer layer 46. Most details of each component are substantially the same as described for FIGS. 2(a)-2(c).

As illustrated in FIG. 2(d), the UBM layer 43 may be formed around the opening of the second polymer layer 46. The UBM layer 43 may be formed of copper or copper alloys, which may include silver, chromium, nickel, tin, gold, and combinations thereof. Additional layers, such as a nickel layer, a lead-free pre-solder layer, or the combinations thereof, may be formed over the copper layer. The UBM layer 43 may have a thickness of between about 1 μm and about 20 μm.

Figure 2E:
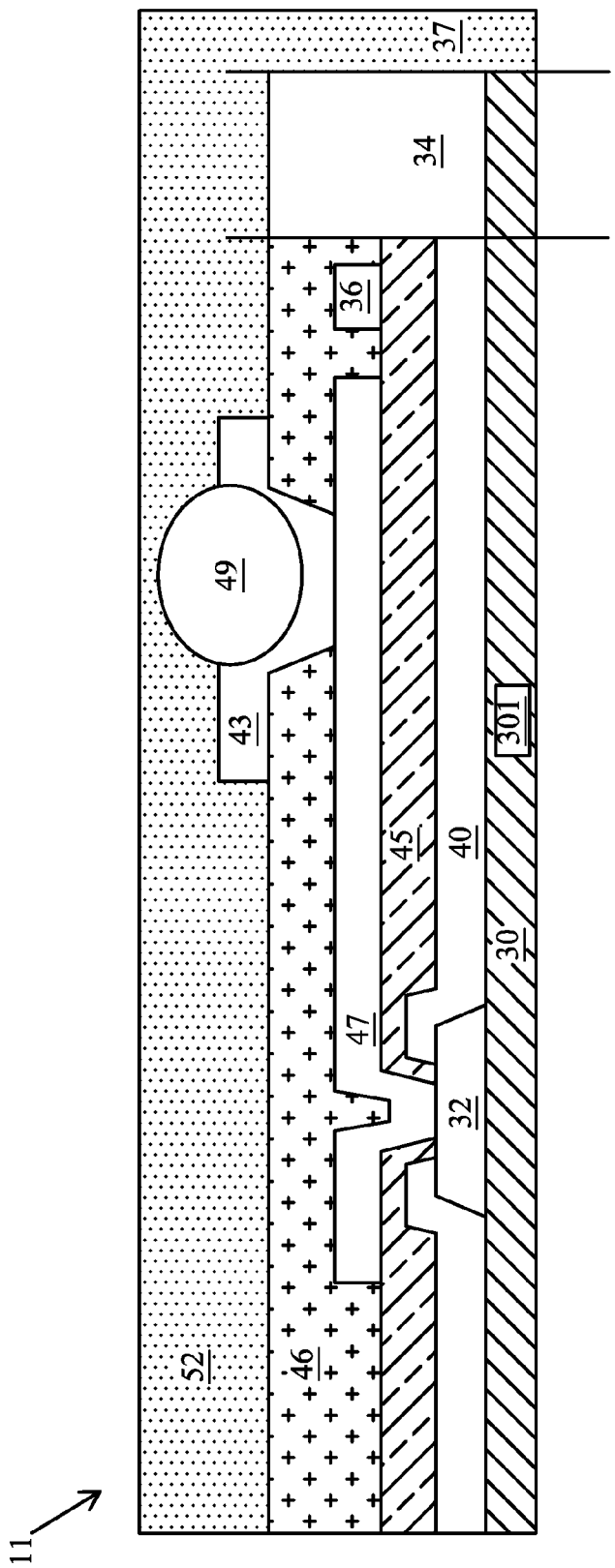

The FIG. 2(e) illustrates an embodiment where a molding layer 52 is placed on the die 11 shown in FIG. 2(d). The molding compound 52 covers the second polymer layer 46, the UBM layer 43, the connector 49, the alignment mark 36, the guard ring 34, and the scribe lines 37. In one embodiment, the molding compound 52 may be a nonconductive material, such as an epoxy, a resin, a moldable polymer, or the like. The molding compound 52 may be formed to provide lateral support to structures, such as connectors, formed on the dies 11. The molding compound 52 may be shaped or molded using a mold. A release compound may be optionally applied to the mold to prevent the molding compound 52 from adhering to the mold. The molding layer 52 can be similarly placed on the die 11 shown in FIGS. 2(a)-2(c).

Figure 3A:
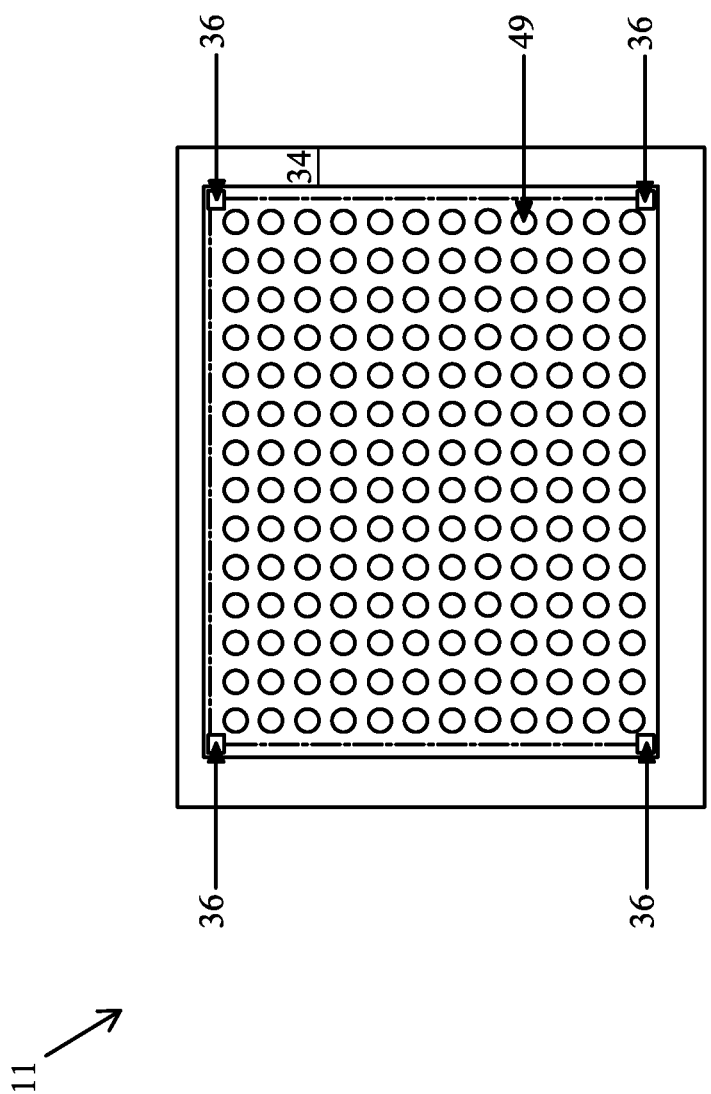
FIGS. 3(a)-3(e) illustrate in top views a plurality of alignment marks on a die, in accordance with some embodiments.
Figure 3B:
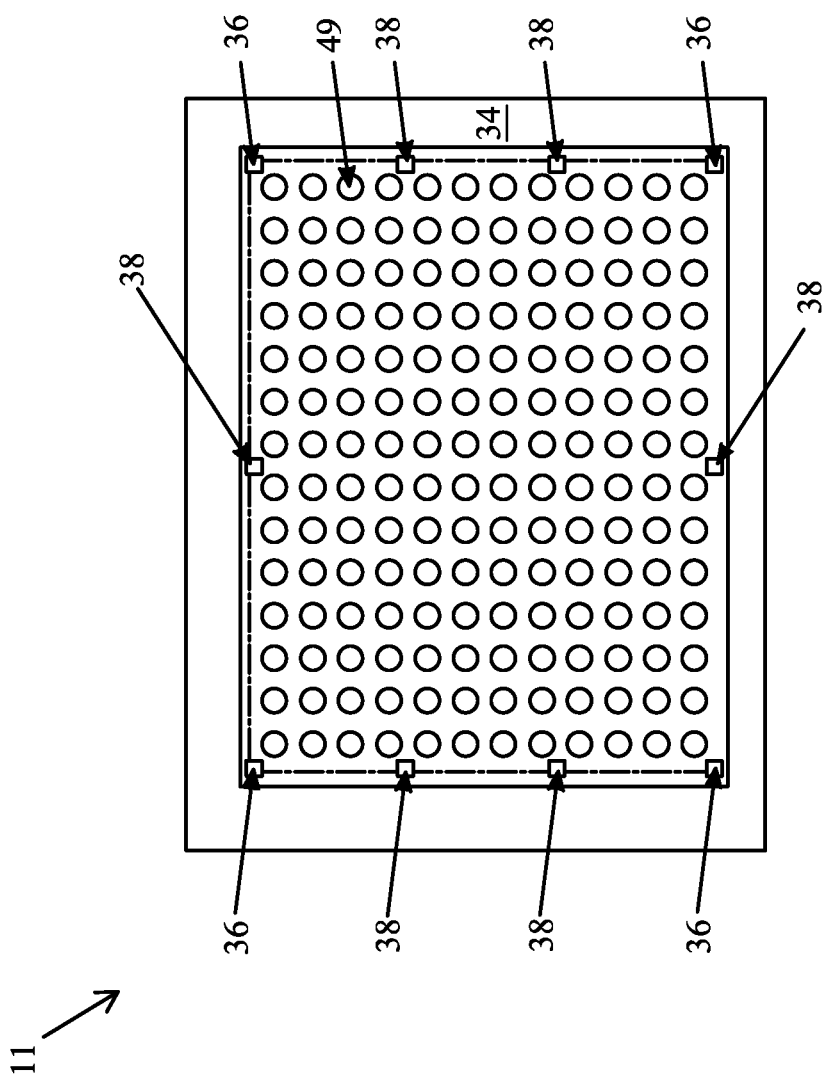

FIGS. 3(a)-3(b) illustrate in top views a plurality of alignment marks 36 on a die 11, in accordance with some embodiments, while only one bond pad 32 is shown in FIGS. 2(a)-2(e).

As illustrated in FIG. 3(a), a plurality of alignment marks 36 is formed near the corners of an area surrounded by the guard ring 34. A plurality of connectors 49 is placed further within the area. The alignment mark 36 is between the connector 49 and the guard ring 34. The connectors 49 may be connected to bond pads by way of PPI layers and UBM layers as shown in FIGS. 2(a)-2(e).

As illustrated in FIG. 3(b), a plurality of alignment marks 38 is formed near the edge of the area surrounded by the guard ring 34. A plurality of connectors 49 is placed further within the area. The alignment mark 38 is between the connector 49 and the guard ring 34. The connectors 49 may be connected to bond pads by way of PPI layers and UBM layers as shown in FIGS. 2(a)-2(e).

Figure 3E:
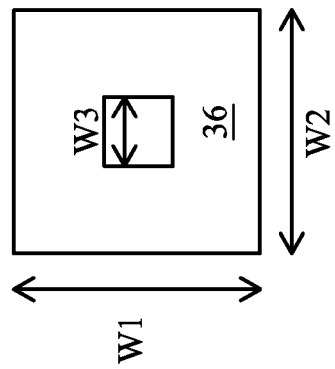
Figure 3D:
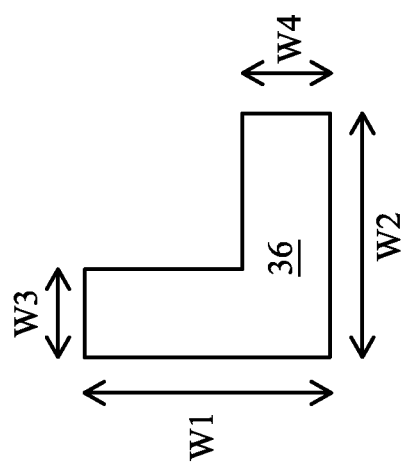
Figure 3C:
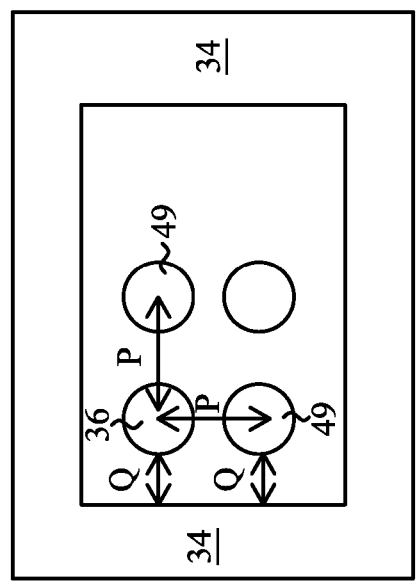

As illustrated in FIG. 3(c), an alignment mark 36 may have a distance Q to the guard ring edge. The distance Q may be within a range from about 80 μm to about 100 μm. The connector 49 may have a distance P to the alignment mark 361. The distance P may be within a range from about 80 μm to about 120 μm.

As illustrated in FIGS. 3(d)-3(e), the alignment mark 36 may be of various shapes. As illustrated in FIG. 3(d), the alignment mark 36 may be of a "L" shape. The alignment mark 361 has a length W3 at the top edge, a length W2 at the bottom edge, a height W1 at the long side, and a height W4 at the short side. The length W3 may be at a range from about 10 μm to about 15 μm. The length W2 may be at a range from about 20 μm to about 25 μm. The height W1 may be at a range from about 20 μm to about 25 μm. The height W4 may be at a range from about 2 μm to about 5 μm.

As illustrated in FIG. 3(e), the alignment mark 36 may be of a hollow shape. The out shape of the alignment mark 36 may be a rectangle with a width of W1 and length W2. The hollow part may be a square of length W3. The width W2 and the length W1 may be at a range from about 20 μm to about 25 μm. The length W3 may be at a range from about 10 μm to about 15 μm. The sizes and shapes are only for illustration purposes and are not limiting. For example, the alignment mark 361 may be a square, a circle, a rectangle, a diamond, and many other kind of shapes and sizes.

FIGS. 4(a)-4(d) illustrate a process of forming a wafer level package (WLP) with an alignment mark on dies, in accordance with some embodiments.

As illustrated in FIG. 4(a), a wafer comprising a die 11 is provided. The die 11 comprises a substrate 30, a bond pad 32 above the substrate 30, a guard ring 34 above the substrate 30. An alignment mark 36 is above the substrate 30, between the bond pad 32 and the guard ring 34. The die 11 may be any of the dies 11 shown in FIGS. 2(a)-2(d). The die 11 may further comprise a passivation layer 40 on the substrate 30, a polymer layer 45 on the passivation layer 40, a post-passivation interconnect (PPI) layer 47 above the polymer layer 45 and in contact with the bond pad 32. The alignment mark 36 may be at the PPI layer 47 above the polymer layer 45.

As illustrated in FIG. 4(b), a connector 49 is placed above the bond pad 32 and electrically connected to the bond pad 32 by way of the PPI layer 47, wherein the connector 49 is between the alignment mark 36 and the bond pad 32. The connector 49 may be placed in a bumping process for the wafer after the die 11 has been fabricated over the wafer.

Figure 4C:
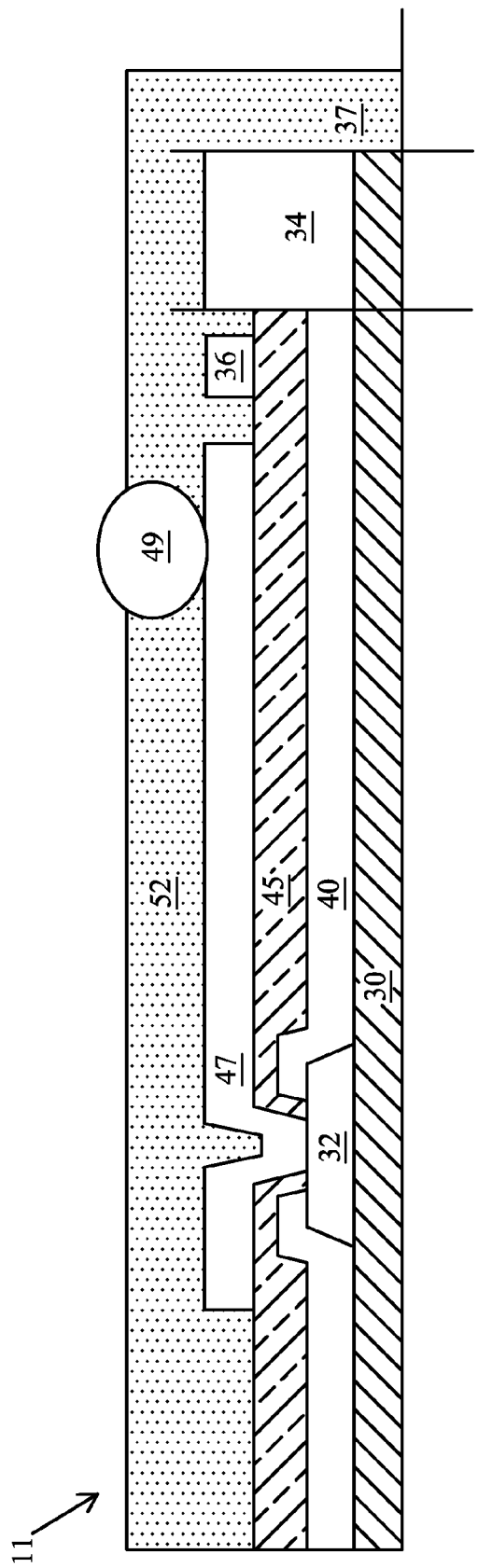

As illustrated in FIG. 4(c), a molding compound layer 52 is formed to cover the second polymer layer 46, the UBM layer 43, the connector 49, the alignment mark 36, the guard ring 34, and the scribe lines 37. In one embodiment, the molding compound 52 may be a nonconductive material, such as an epoxy, a resin, a moldable polymer, or the like. The molding compound 52 may be formed to provide lateral support to structures, such as connectors, formed on the dies 11. The molding compound 52 may be shaped or molded using a mold. A release compound may be optionally applied to the mold to prevent the molding compound 52 from adhering to the mold.

Figure 4D:
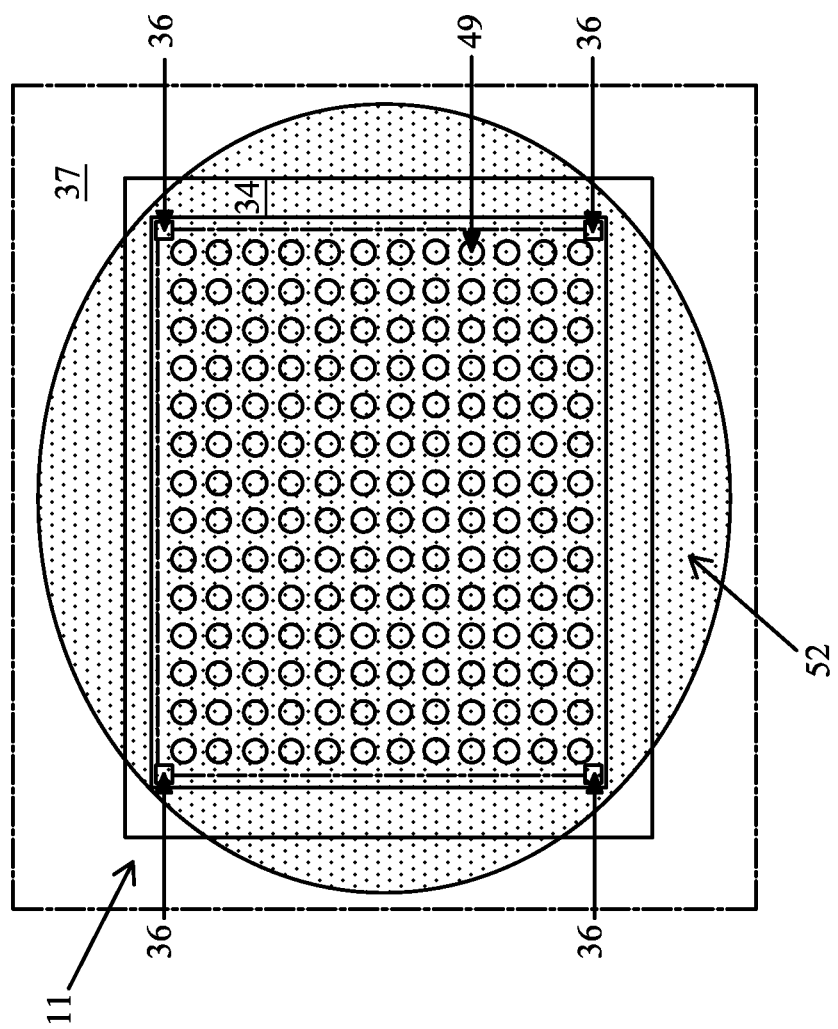

FIG. 4(d) illustrates an embodiment where multiple alignment marks 36 are formed on the die 11 which is covered by the molding compound 52. The die 11 comprises a plurality of bond pads connected to a plurality of connectors 49, placed within the area surrounded by the guard ring 34. A plurality of alignment marks 36 is formed on a substrate, between the connectors 49 and the guard ring 34. The molding compound layer 52 is formed to cover the alignment marks 36, the connectors 49, the guard ring 34, and the scribe line 37.

Dicing is the process for cutting the wafer containing the die 11 shown in FIG. 4(d). The dicing process separates the dies 11 from the wafer. The dicing process can be accomplished by scribing and breaking, by mechanical sawing (normally with a machine called a dicing saw) or by laser cutting. The molding compound 52 may be transparent that the alignment mark 36 may be visible above the molding compound 52. The alignment mark 36 formed at the same layer as the bond pad or the PPI layer is closer to the surface of the die 11 and easier to see. Alternatively, some other technology such as a laser can be used to detect the location of the alignment marks 36, which will be used as reference points for the dicing of the wafer. The alignment marks 36 may be used in addition with other alignment marks at other areas, formed at different times, to further increase the alignment accuracy.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
    a substrate;
    a first bond pad above the substrate;
    a passivation layer over the substrate, the passivation layer having a first portion above the bond pad;
    a guard ring above the substrate; and
    a first alignment mark in and/or above a second portion of the passivation layer, the first alignment mark being between the first bond pad and the guard ring.

2. The semiconductor device of claim 1, wherein the first alignment mark is of a shape selected from a group comprising essentially of a circle, a square, a diamond, an L shape, or a hollow shape.

3. The semiconductor device of claim 1, wherein the first alignment mark is at a same layer above the substrate as the first bond pad.

4. The semiconductor device of claim 1, further comprising:
    a passivation layer on the substrate, covering a first part of the first bond pad while exposing a second part of the first bond pad;
    a first polymer layer on the passivation layer and partially exposing the first bond pad;
    a post-passivation interconnect (PPI) layer above the first polymer layer and in contact with the first bond pad; and
    wherein the first alignment mark is at the PPI layer above the first polymer layer.

5. The semiconductor device of claim 4, further comprising a second alignment mark at a different layer from the PPI layer.

6. The semiconductor device of claim 4, further comprising:
    a connector on the PPI layer, wherein the connector is between the first bond pad and the guard ring, and the first alignment mark is between the connector and the guard ring.

7. The semiconductor device of claim 4, further comprising:
    a second polymer layer on the first polymer layer, and on the PPI layer with an opening to expose the PPI layer;
    an under-bump metallurgy (UBM) layer over the second polymer layer, covering the opening of the second polymer layer and electrically connected to the PPI layer; and
    a connector on the UBM layer, wherein the connector is between the first bond pad and the guard ring, and the first alignment mark is between the connector and the guard ring.

8. The semiconductor device of claim 1, further comprising:
    a second bond pad above the substrate, wherein the first bond pad and the second bond pad are within an area surrounded by the guard ring; and
    a second alignment mark on the substrate, between the second bond pad and the guard ring.

9. The semiconductor device of claim 1, wherein the first alignment mark is at a corner of an area surrounded by the guard ring, and the first bond pad is within the area.

10. The semiconductor device of claim 1, wherein the first alignment mark is close to an edge of an area surrounded by the guard ring, and the first bond pad is within the area.

11. A semiconductor device, comprising:
    a substrate;
    a first bond pad above the substrate;
    a guard ring above the substrate;
    a passivation layer on the substrate, covering a part of the first bond pad while exposing the first bond pad;
    a first polymer layer on the passivation layer and partially exposing the first bond pad;
    a post-passivation interconnect (PPI) layer above the first polymer layer and in contact with the first bond pad; and
    a first alignment mark above the substrate, between the first bond pad and the guard ring.

12. The semiconductor device of claim 11, wherein the first alignment mark is at the PPI layer above the first polymer layer.

13. The semiconductor device of claim 11, further comprising a second alignment mark at a different layer from a layer the first alignment mark is at.

14. The semiconductor device of claim 11, further comprising:
    a connector on the PPI layer, wherein the connector is between the first bond pad and the guard ring, the first alignment mark is between the connector and the guard ring.

15. The semiconductor device of claim 11, further comprising:
    a second polymer layer on the first polymer layer, and on the PPI layer with an opening to expose the PPI layer;
    an under-bump metallurgy (UBM) layer over the second polymer layer, covering the opening of the second polymer layer and electrically connected to the PPI layer; and
    a connector on the UBM layer, wherein the connector is between the first bond pad and the guard ring, the first alignment mark is between the connector and the guard ring.

16. A semiconductor device comprising:
- a bond pad on a substrate;
- a passivation layer over the substrate and the bond pad, a first opening being defined through the passivation layer to the bond pad;
- a guard ring along an edge of the passivation layer;
- a first alignment mark in and/or above the passivation layer, the first alignment mark being between the bond pad and the guard ring;
- an interconnection over the passivation layer, the interconnection being coupled to the bond pad through the first opening; and
- an external connector being coupled to the interconnection.

17. The semiconductor device of claim 16, wherein the first alignment mark is in the passivation layer.

18. The semiconductor device of claim 16 further comprising:
- a polymer layer over the passivation layer, a second opening being defined through the polymer layer and the first opening to the bond pad, the interconnection being over the polymer layer and coupled to the bond pad through the second opening.

19. The semiconductor device of claim 18, wherein the first alignment mark is over the polymer layer.

20. The semiconductor device of claim 19 further comprising a second alignment mark in the passivation layer.

* * * * *